(12) United States Patent
Kang et al.

(10) Patent No.: US 7,851,778 B2
(45) Date of Patent: Dec. 14, 2010

(54) NON-VOLATILE ELECTRICAL PHASE CHANGE MEMORY DEVICE COMPRISING INTERFACIAL CONTROL LAYER AND METHOD FOR THE PREPARATION THEREOF

(75) Inventors: Dae-Hwan Kang, Seoul (KR); In-Ho Kim, Seoul (KR); Byung Ki Cheong, Seoul (KR); Jeung-Hyun Jeong, Seoul (KR); Taek Sung Lee, Seoul (KR); Won Mok Kim, Seoul (KR); Ki-Bum Kim, Seoul (KR)

(73) Assignees: Korea Institute of Science and Technology (KR); Seoul National University Industry Foundation (KR)

( * ) Notice: Subject to any disclaimer, the term of this patent is extended or adjusted under 35 U.S.C. 154(b) by 189 days.

(21) Appl. No.: 11/805,827

(22) Filed: May 24, 2007

(65) Prior Publication Data
US 2007/0272987 A1 Nov. 29, 2007

(30) Foreign Application Priority Data
May 24, 2006 (KR) ...................... 10-2006-0046409

(51) Int. Cl.
*H01L 47/00* (2006.01)
*H01L 21/00* (2006.01)
(52) U.S. Cl. ........................ 257/4; 257/E29.33; 438/95
(58) Field of Classification Search ................. 257/379, 257/536, 2, 4, 499, 528, E29.33, E21.613; 438/900, 31, 95, 332, 336, 641
See application file for complete search history.

(56) References Cited
U.S. PATENT DOCUMENTS
6,313,010 B1 * 11/2001 Nag et al. ................... 438/435

6,426,891 B1 * 7/2002 Katori ........................ 365/175
2003/0156468 A1 * 8/2003 Campbell et al. ........... 365/200
2006/0113537 A1 * 6/2006 Krulevitch et al. ............ 257/57

OTHER PUBLICATIONS

Quirk, "Semiconductor Manufacturing Technology", 2001, Prentice-Hall, pp. 336-337, 436-437, 231-232, 236.*
Fair, "History of some early development . . . ", 1998, Proceedings of IEEE, vol. 68, No. 1, pp. 111-137.*

* cited by examiner

*Primary Examiner*—Thomas L Dickey
*Assistant Examiner*—Nikolay Yushin
(74) *Attorney, Agent, or Firm*—Baker & Hostetler LLP

(57) ABSTRACT

The present invention relates to a non-volatile electrical phase change memory device comprising a substrate, a first interlayer dielectric film deposited on the substrate, a bottom electrode layer formed on the first dielectric layer, a second interlayer dielectric film formed on the bottom electrode layer, a phase change material layer deposited on the second interlayer dielectric film, and a top electrode layer formed on said phase change material layer, the bottom electrode layer being brought into contact with the phase change material layer through a contact hole which is formed in the second interlayer dielectric film and filled with the phase change material or bottom electrode material, so that the phase change layer and the bottom electrode layer come into close contact with each other, wherein an interfacial control layer is formed at the interface of the contact hole between the phase change layer and the bottom electrode layer, said interfacial control layer having strong chemical bonds with the phase change material as well as electrical resistivity and thermal conductivity values lower than those of the bottom electrode material.

10 Claims, 10 Drawing Sheets

NON-VOLATILE ELECTRICAL PHASE CHANGE MEMORY DEVICE COMPRISING INTERFACIAL CONTROL LAYER AND METHOD FOR THE PREPARATION THEREOF

FIELD OF THE INVENTION

The present invention relates to a non-volatile electrical phase change memory device comprising an interfacial control layer and a method for preparing the same that can produce more stable write/read characteristics during cyclic operations and thus improve write endurance.

DESCRIPTION OF THE PRIOR ART

Non-volatile electrical memory devices, suggested by Ovonyx, Inc. and Energy Conversion Devices, Inc., have been developed through the implementation of a chalcogenide-based phase change material which can undergo fast and reversible phase changes between the crystalline and amorphous states under the electrical Joule heating of varying schemes, and achieve information storage by exploiting the difference in electrical resistance between the crystalline and amorphous states (See U.S. Pat. Nos. 5,359,205, 5,414,271, 5,536,947 and 5,534,712). Such an electrical phase change memory device has a high scalibility due to simple device structure, fast read/write performances with good data retention, and multi-bit memory operation capability, which has become an attractive non-volatile memory device for replacing flash memories.

Figure 1A:
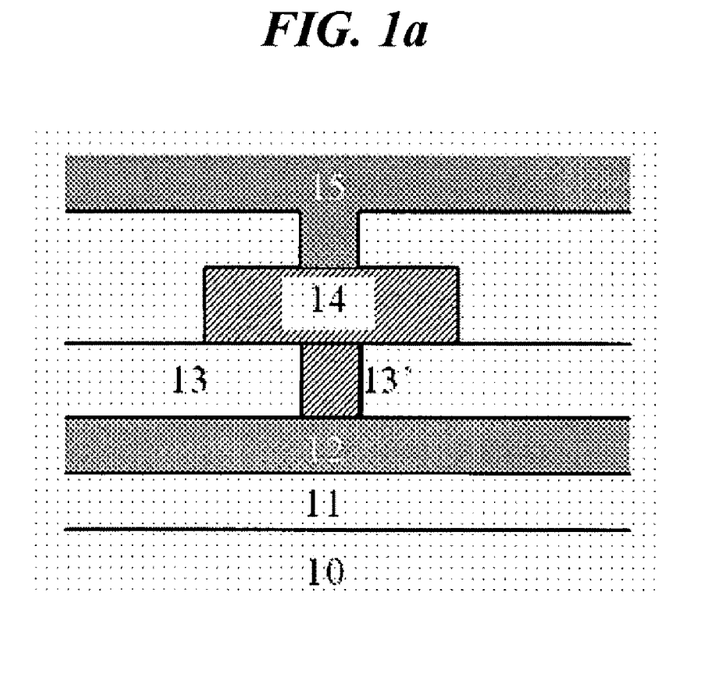
FIGS. 1a and 1b: sectional views of exemplary non-volatile electrical phase change memory device of the prior art.

A conventional electrical phase change memory device has a structure comprising a pore region through which a phase change material comes into contact with a bottom electrode at the lower portion of the pore region, as shown in FIG. 1a, which is prepared by sequentially forming, on a silicon substrate (10), an interlayer dielectric film (11), a bottom electrode (12) and another interlayer dielectric film (13) on which a pore (13') having a pore diameter of 100 nm or less is formed by photolithography or electron beam lithography followed by etching, depositing a chalcogenide material such as $Ge_2Sb_2Te_5$ or $Ge_1Sb_2Te_4$ as a phase change material to form a layer (14) and also to fill the pore (13), forming an upper metal electrode (15) thereon, and conducting photolithography and subsequent etching to form the memory cell unit represented by FIG. 1.

Figure 1B:
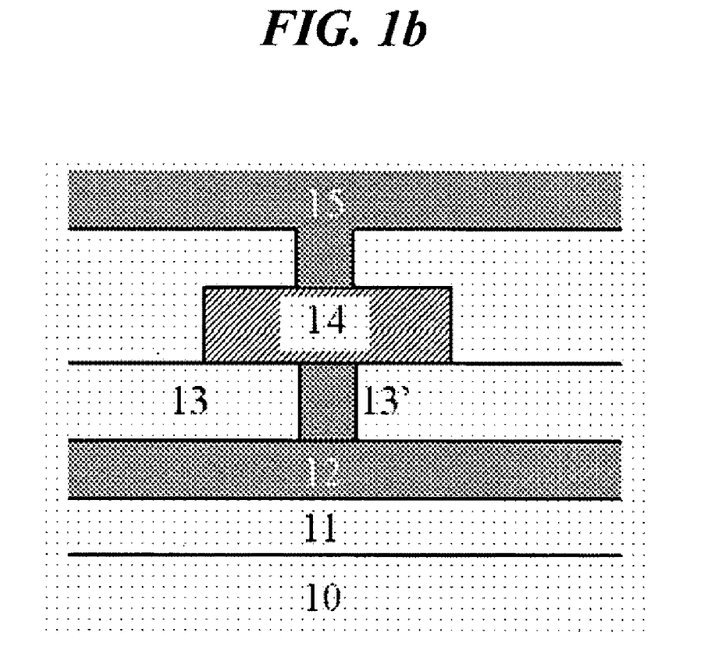

Alternatively, the pore region (13') can be filled with the material of the bottom electrode (12) instead of the phase change material (14), as shown in FIG. 1b, so that the contact of the bottom electrode material with the phase change material takes place at the upper portion of the pore.

In the electrical phase change memory device, a write operation is conducted by applying an electric voltage or current pulse between the top and bottom electrodes to produce joule-heating of the chalcogenide-based phase change material. The magnitude of joule-heat varies depending on the level and the duration of the electric pulse and determines the phase state of the chalcogenide-based material between a crystalline phase (set state) and an amorphous phase (reset state). Importantly, electric current and joule-heating are mostly confined in the pore region including the interface between the bottom electrode and the phase change material during a write operation. The electrical resistances of the crystalline and amorphous phase states are different by a factor of $10^4 \sim 10^5$, rendering a similarly large difference in electrical resistance between the two device states, set and reset states, each being assigned a bit state of 0 and 1. During a read operation, the electrical resistance of a device state is detected using an electric pulse leading to little joule-heating.

One of the problems with the conventional phase change memory devices is found that the electrical resistances in the set/reset states are not sufficiently stable, leading to fluctuation of the switching voltage as well as the set/reset voltages at successive writing operations. Such fluctuation of the operational factors is reported to induce malfunctions and degraded endurance, therefore, harmful to the reliability of the device (See S. Lai, *International Electron Devices Meetings*, 2003, pp. 255-258).

Also, it has been reported that the reliability of a phase change memory device depends on the interface property between the phase change material and electrodes (See Reliability study of phase-change nonvolatile memories, *IEEE Transactions on Device and Materials Reliability*, vol. 4, pp. 422-427).

Accordingly, there has existed a need for developing a highly reliable memory device having improved interfacial properties.

SUMMARY OF THE INVENTION

It is an object of the present invention to provide a non-volatile electrical phase change memory device having improved interfacial properties to enhance the stability of the device's electrical characteristics during successive write/read operations and write endurance, and a method for preparing same.

In accordance with one aspect of the present invention, there is provided a non-volatile electrical phase change memory device comprising a substrate, a first interlayer dielectric film deposited on the substrate, a bottom electrode layer formed on the first dielectric layer, a second interlayer dielectric film formed on the bottom electrode layer, a phase change material layer deposited on the second interlayer dielectric film, and a top electrode layer formed on said phase change material layer, the bottom electrode layer being brought into contact with the phase change material layer through a contact hole which is formed in the second interlayer dielectric film and filled with the phase change material or bottom electrode material, so that the phase change layer and the bottom electrode layer come into close contact with each other, wherein an interfacial control layer is formed at the interface of the contact hole between the phase change layer and the bottom electrode layer, said interfacial control layer having strong chemical bonds with the phase change material as well as electrical resistivity and thermal conductivity values lower than those of the bottom electrode material.

In accordance with another aspect of the present invention, there is provided a method for preparing said non-volatile electrical phase change memory device, which comprises 1) forming sequentially on the substrate the first interlayer dielectric film, the bottom electrode layer, and the second interlayer dielectric film, and then the contact hole by photolithography or electron beam lithography and subsequent etching in the second interlayer dielectric film that extends to the top surface of the bottom electrode, and optionally filling the contact hole with the bottom electrode material to bring the bottom electrode layer into contact with the phase change layer; 2) forming the interfacial control layer at the interface of the contact hole between the bottom electrode and the phase change layer; and 3) forming sequentially the phase change material layer and the top electrode layer on the second interlayer dielectric film comprising the interfacial control layer, followed by patterning using a lithography process.

BRIEF DESCRIPTION OF THE DRAWINGS

The above and other objects and features of the present invention will become apparent from the following description of the invention taken in conjunction with the accompanying drawings, which respectively show.

DETAILED DESCRIPTION OF THE INVENTION

The non-volatile electrical phase change memory device of the prevent invention is characterized in that it comprises an interfacial control layer which has strong chemical bonds with the phase change material and whose electrical conductivity and thermal conductivity are lower than those of the bottom electrode material, on the contact surface between the phase change material and the bottom electrode material.

Figure 2A:
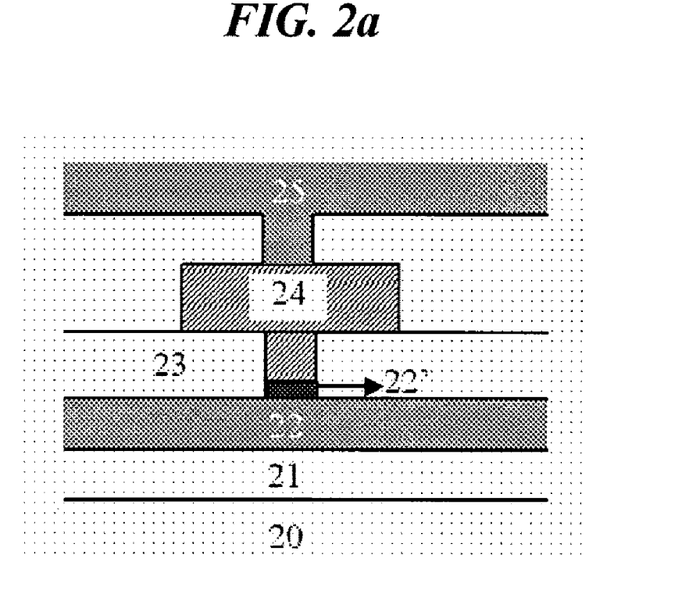
FIGS. 2a and 2b: sectional views of exemplary non-volatile electrical phase change memory device comprising the interfacial control layer of the present invention.
Figure 2B:
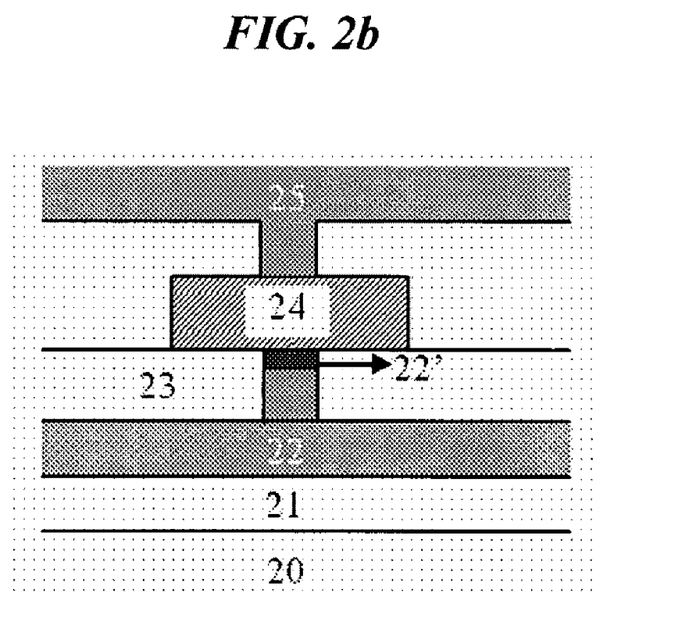

The inventive memory device, as shown in FIGS. 2a and 2b, comprises a substrate (20), a first interlayer dielectric film (21), a bottom electrode layer (22), a second interlayer dielectric film (23), a contact hole (23'), an interfacial control layer (23''), a phase change material layer (24) and a top electrode layer (25). The substrate, electrode layers, interlayer dielectric films and phase change material layer may be formed by conventional methods using materials well known in the art.

The non-volatile electrical phase change memory device according to the present invention may be prepared as follows.

First, on a substrate such as silicon (20), a first interlayer dielectric film (e.g., $SiO_2$) is formed, on which Ti and TiN are deposited by a sputtering process to form a bottom electrode layer (22). On the bottom electrode layer 22, $SiO_2$ is deposited by plasma-enhanced chemical vapor deposition (PECVD) to form a second interlayer dielectric film (23), in which a contact hole having a diameter of 10 to 100 nm (23') is formed by photolithography or electron beam lithography and subsequent etching process such as reactive ion etching so that the hole is formed in the second interlayer dielectric film (23) preferably in the perpendicular direction, to expose the bottom electrode. The contact hole (23') may be optionally filled with the bottom electrode material to form a contact surface on the lower or upper region of the contact hole (23').

Then, the surface of the bottom electrode exposed through the contact hole may be oxidized by heat treatment under an oxygen atmosphere or oxygen plasma treatment, by an ion injection process to deposit an oxide on the surface, or by depositing separately an oxide on the surface, to form an interfacial control layer (23'') consisting of an oxide of the electrode material, to a thickness of 20 nm or less, preferably 10 nm or less. Exemplary oxides of the electrode material include Ti—O, Ti—N—O, Ti—Al—N—O, W—O, W—N—O and Ti—W—O and Ti—W—O—N.

Alternatively, the interfacial control layer (23'') may be formed by depositing a Ge—Sb—Te-based material modified by changing elemental fractions thereof or by adding another doping element thereto, on the exposed surface of the bottom electrode. The composition of modified Ge—Sb—Te-based material is different from that of the phase change material layer (24) to be deposited later.

Finally, deposited on the second interlayer dielectric film (23) comprising the interfacial control layer (23'') is with a Ge—Sb—Te based material by RF sputtering to form the phase change material layer (24), on which TiN and Al are deposited by a sputtering process and an electron beam deposition, respectively, to form the top electrode layer (25), followed by patterning using a photolithography and subsequent etching process, to obtain a non-volatile electrical phase change memory device.

The non-volatile electrical phase change memory device thus prepared comprises the interfacial control layer in the interface between the phase change material layer and the bottom electrode, which can improve the interfacial properties thereof.

Such improvement of the interfacial properties according to the present invention will be explained in detail as follows.

Generally, the fluctuation of the operational factors and operational stability of a phase change memory device is strongly affected by the electrical properties of the interface between the bottom electrode and the phase change material. The total electrical resistance of a memory cell may be represented by the sum of sheet resistance ($R_{Sh}$) of the phase change material itself and contact resistance ($R_C$) which depends on the interfacial properties, neglecting contributions from metallic layers. The sheet resistance of the phase change material varies as switching takes place between the crystalline (set) and amorphous (reset) states. As the sheet resistance difference between the set and reset states becomes increasingly larger, the operation of the memory device becomes more stable.

However, if the portion of the sheet resistance becomes a minor component of the total electrical resistance, i.e., if the contact resistance becomes equal to or higher than the sheet resistance, the signal ratio between the set and reset states becomes low, tending to increase the possibility of an unstable operation of the memory device. Such a signal ratio is determined by the following equation:

$$\text{Signal Ratio} = \frac{(R_{Sh} + R_C)_a}{(R_{Sh} + R_C)_x}$$

wherein, a represents the amorphous (reset) state and x represents the crystalline (set) state.

A high contact resistance is harmful to a stable device operation in another respect. The contact surface between the phase change material layer and the bottom electrode is essentially planar and very limited in extent. Therefore, a local structural or compositional variation at the contact surface may give rise to a large variation in the contact resistance. When the contact resistance comprises a major portion of the total electrical resistance, such variation in the contact resistance may give rise to a large fluctuation in the total electrical resistance. This would generate, in turn, fluctuation in the voltage or current required to produce a phase change and the resistance of the resulting state. Therefore, it is critically important to reduce the contact resistance of the interface between the phase change material layer and the bottom electrode.

Furthermore, the operational stability of a phase change memory device is affected by the temperature and phase distribution near the interface between the phase change material layer and the bottom electrode. The phase change material layer comes into direct contact with the bottom electrode having a high thermal conductivity (e.g., the TiN electrode having the thermal conductivity of 20 W/mK, as compared with the phase change material $Ge_2Sb_2Te_5$ of 0.17~0.5 W/mK), and thus, heat loss is much greater near the interface than in the inner side. Accordingly, the phase change material adjacent to the interface is not heated enough for crystallization or melting and tends to remain untransformed during set or reset operation. Consequently, a tandem structure of a crystalline and an amorphous phase appears from the interface up into the phase change material layer during reset operation and likewise that of an amorphous and a crystalline phase during set operation. Due to a steep temperature distribution within the phase change material layer, such a tandem structure tends to be very unstable in terms of relative phase fraction with respect to fluctuations in reset/set voltage (or current). In view of a large difference in electrical resistivity between crystalline and amorphous phases, the tandem structure of a varying phase fraction is supposed to give rise to a serial resistance of a varying magnitude.

On considering above matters, the non-volatile electrical phase change memory device of the present invention is favorable in that it has the interfacial control layer which bonds to the phase change material much more strongly than the bond of the phase change material with the bottom electrode, thereby reducing the contact resistance at the interface between the phase change material and the bottom electrode. This achieves the improvement of the signal ratio between reset and set states, and the reduction of the fluctuation in electrical resistances of reset/set states and thus in reset/set voltage or current in the following switching operation.

Also, the interfacial control layer is mechanically and chemically stable at a high temperature and its electrical and thermal conductivity are low, which would enhance heat-generation as well as heat-confinement effect at the interface to achieve a uniform temperature and phase distribution within the phase change region By the inclusion of the interfacial control layer having such characteristics, the non-volatile electrical phase change memory device according to the present invention has a reduced contact resistance at the interface between the phase change material layer and the bottom electrode and uniform temperature and phase distribution to provide a large set/reset signal ratio, reduced fluctuation of the operation voltage (or current) during set/reset operations, as well as an increased operational life.

The present invention will be described in further detail with reference to Examples. However, it should be understood that the present invention is not restricted by the specific Examples.

REFERENCE EXAMPLE 1

In order to examine the electrical characteristics of the interfaces between the phase change material and the electrodes, contact resistances were measured using a transmission line model (TLM) by the following procedure.

Figure 3A:
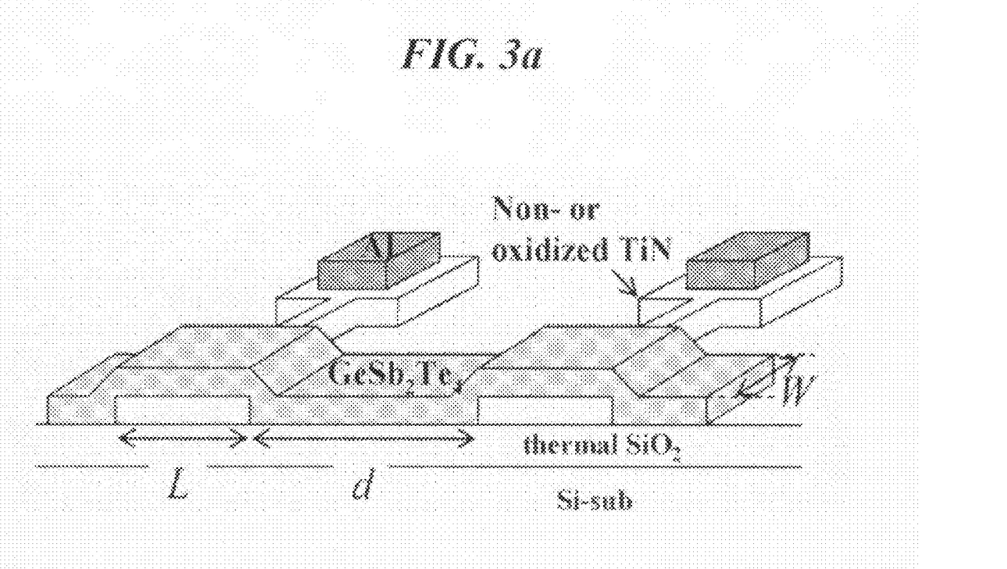
FIGS. 3a and 3b: a schematic diagram and an optical microscope image of the sample prepared in Reference Example 1 for transmission line model (TLM) method, respectively.
Figure 3B:
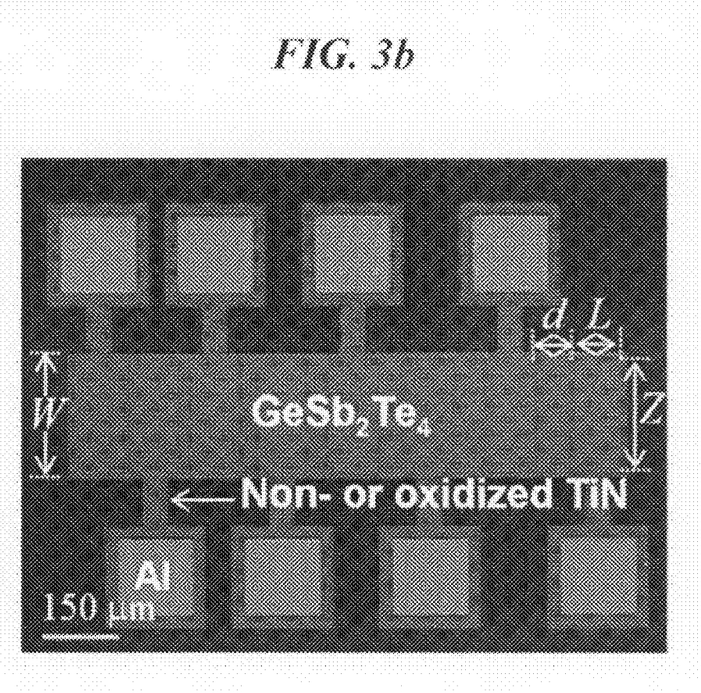

First, a $SiO_2$ film was formed thermally on a silicon substrate, on which a 100 nm-thick layer of TiN is deposited using a sputtering method, followed by photolithography and dry etching to form an array of TiN electrodes having length L, and width Z, and varying spacing d. The surfaces of the TiN electrodes were oxidized under an atmospheric $N_2/O_2$ gas mixture (97.9/2.1 vol/vol %) at 350° C. for 30 minutes. On the oxidized TiN electrode, a phase change material, $Ge_1Sb_2Te_4$, was deposited by sputtering and patterned to a width W, and finally Al electrode pads were formed to obtain a sample for use in a TLM method, as shown in FIGS. 3a and 3b.

The TLM is well used for measuring the contact resistance ($R_C$) and the sheet resistance ($R_{Sh}$) of a semiconductor material being capable of forming an ohmic contact with an electrode, by having a large electrode width, Z, with respect to the spacing, d, between electrodes so as to render the electric field between electrodes approximately one-dimensional without edge effects.

REFERENCE EXAMPLE 2

The procedure of Reference Example 1 was repeated except that the surface of the TiN electrode was not oxidized, to obtain a sample having no oxidized electrode layer.

EXPERIMENTAL EXAMPLE 1

Figure 3C:
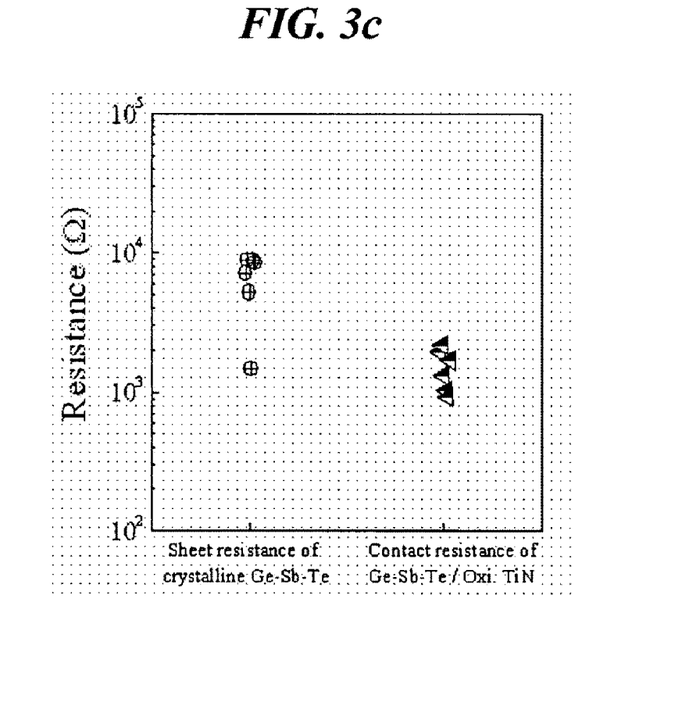
FIGS. 3c and 3d: the contact and sheet resistances of the samples prepared in Reference Examples 1 and 2 for their crystalline states, respectively.
Figure 3D:
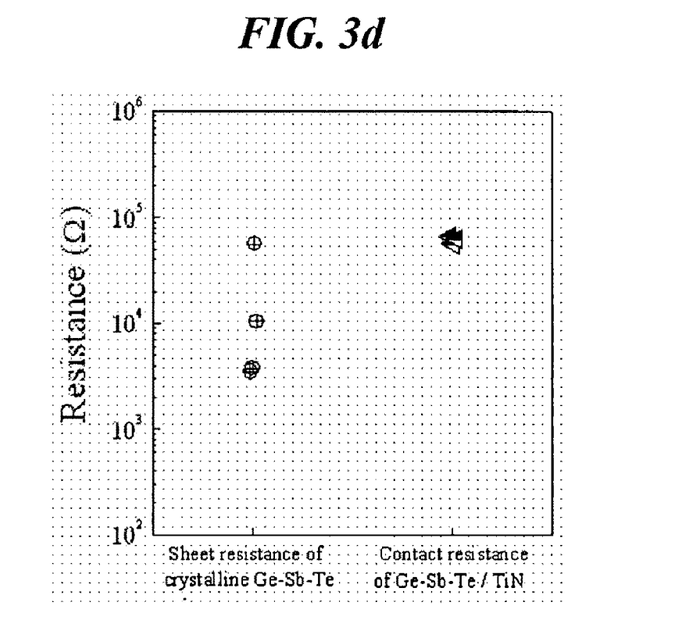

Each of the samples prepared in Reference Examples 1 and 2 was subjected to total electrical resistance measurement by varying the spacing, d, between the electrodes. The contact and sheet resistances of the phase change material in the crystalline state were determined using the following equation. The results are shown in FIGS. 3c (Ref. Ex. 1) and 3d (Ref Ex. 2).

$$R_T = 2R_c + R_{sh}\frac{d}{W}$$

As shown in FIGS. 3c and 3d, the sample prepared in Reference Example 1 has a contact resistance which is remarkably reduced relative to the sheet resistance, while the sample prepared in Reference Example 2 has the contact resistance equal to or greater than the sheet resistance.

EXPERIMENTAL EXAMPLE 2

Figure 4A:
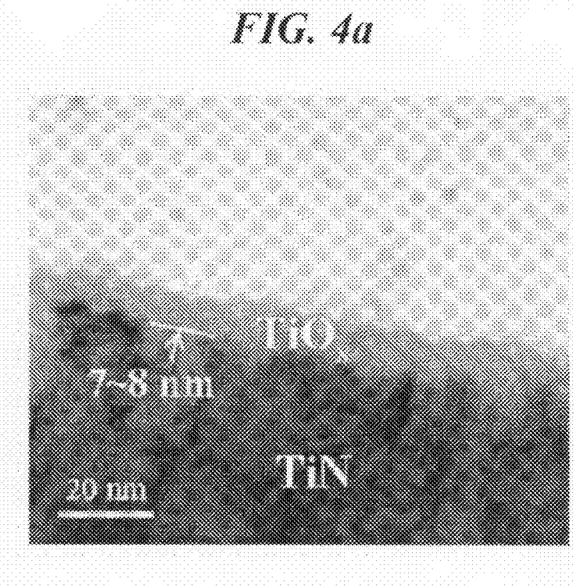
FIG. 4a: a high resolution transmission electron microscope image obtained from the TiN film sample with an oxidized layer.

The interfacial structure of the TiN film with an oxidized surface was analyzed with a high resolution transmission electron microscope, and the result is shown in FIG. 4a.

As shown in FIG. 4a, the sample prepared in Reference Example 1 has a thin $TiO_x$ interface layer of 7 to 8 nm thickness.

By analyzing the calculated electron diffraction patterns due to fast Fourier transform of a high resolution transmission electron microscope image, it is concluded that the $TiO_x$ layer consists probably of $Ti_2O_3$ which is either semiconducting or semi-metallic unlike insulating $TiO_2$.

EXPERIMENTAL EXAMPLE 3

The bonding characteristics of the phase change material ($Ge_1Sb_2Te_4$) at the $TiO_x$ interface was analyzed by an X-ray photoelectron spectroscopy, and the result was compared with the case of no oxidized interface. The results are shown in FIG. 4b.

Figure 4B:
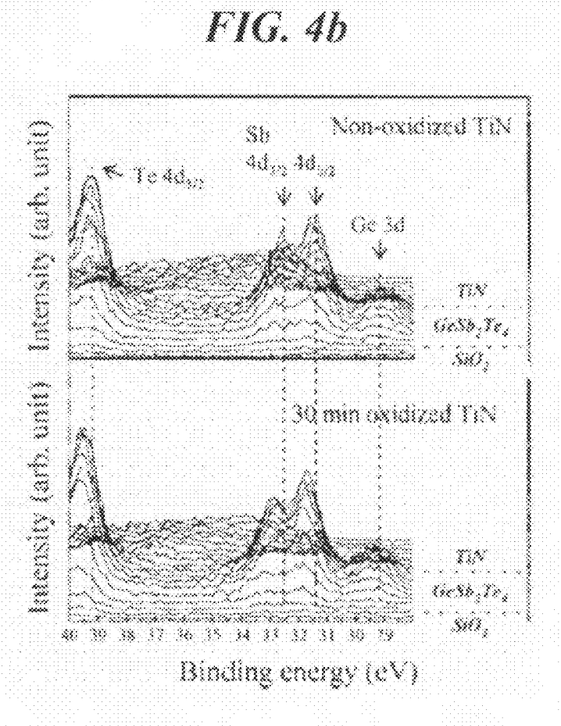
FIG. 4b: X-ray photoelectron spectra obtained from the layered structures of $SiO_2/GeSb_2Te_4/TiN$ without and with an oxidized layer.

As can be seen in FIG. 4b, the case with an oxidized layer shows that all the peaks due to the elements of the phase change material are shifted to the higher energies as compared with the case having no oxidized layer. Such energy shifts are due to the higher bond strengths of Ge, Sb and Te element with oxygen than with nitrogen, as shown in Table 1.

TABLE 1

| | Bonding Energy (D°) (kcal/mol) | | Bonding Energy (D°) (kcal/mol) |
|---|---|---|---|
| Ge—N | [a]123.36 | Ge—O | 158.2 ± 3 |
| Sb—N | 72 ± 12 | Sb—O | 89 ± 20 |
| Te—N | [b]90.52 | Te—O | 93.4 ± 2 |

$D° (A - B) = \Delta H°_f(A) + H°_f(B) - H°_f(AB)$
[a] corresponds for $Ge_2N(g)$
[b] is represented by using the information for $SeN(g)$ The higher bond strengths of the Ge, Sb and Te elements with oxygen would render an interface that could possibly have less defects due to increased energy barrier for defect formation hence a reduced contact resistance to improve the interfacial properties of the device.

EXAMPLE 1

Figure 5A:
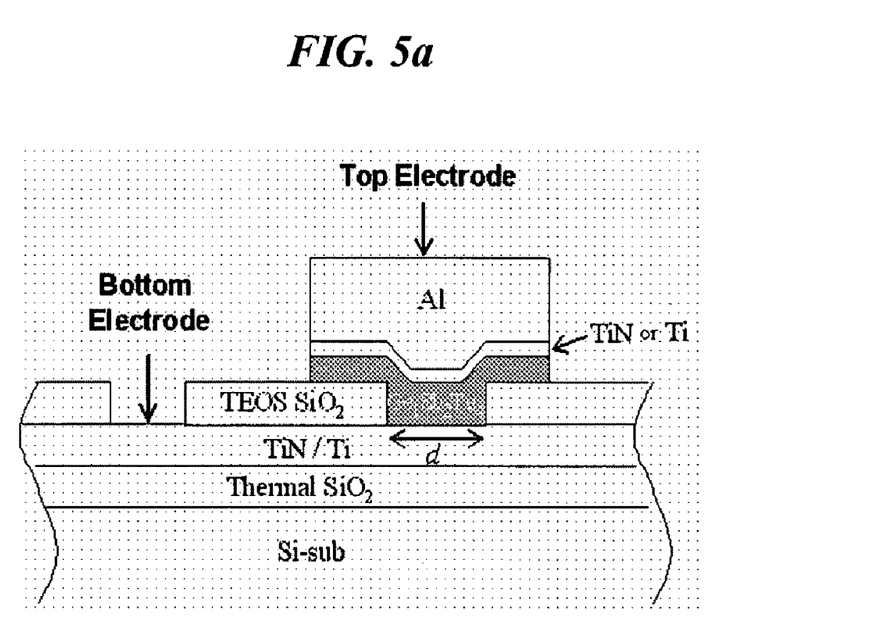
FIGS. 5a and 5b: a sectional view and a scanning electron microscope image, respectively, of the non-volatile electrical phase change memory device comprising an interfacial control layer, prepared in Example 1.

An $SiO_2$ film was formed on a silicon substrate, on which Ti and TiN layers were sequentially deposited to a thickness of 100 nm, respectively, using a sputtering process to form a bottom electrode layer. On the bottom electrode, $SiO_2$ was deposited by PECVD using tetraethoxysilane and oxygen as sources to form an interlayer dielectric film to a thickness of 100 nm, in which a contact hole having a diameter of 50 nm or 70 nm was formed by electron beam lithography and reactive ion etching (RIE) for the bottom electrode to be exposed. Thereto, a $N_2/O_2$ gas mixture (97.9/2.1 vol/vol %) was introduced under an ambient pressure at 350° C. for 30 minutes to oxidize the exposed TiN surface of the bottom electrode, to form an interfacial control layer having a thickness of 7 to 8 nm. Thereon, a phase change material, $Ge_1Sb_2Te_4$, was deposited to a thickness of 100 nm by RF sputtering, on which a 50 nm thick TiN layer and a 100 nm thick Al layer were deposited by sputtering and electron beam deposition, respectively, to form a top electrode layer. Then, a patterning process was conducted using a photolithography and subsequent etching process, to obtain a non-volatile electrical phase change memory device, as shown in FIG. 5a.

Figure 5B:
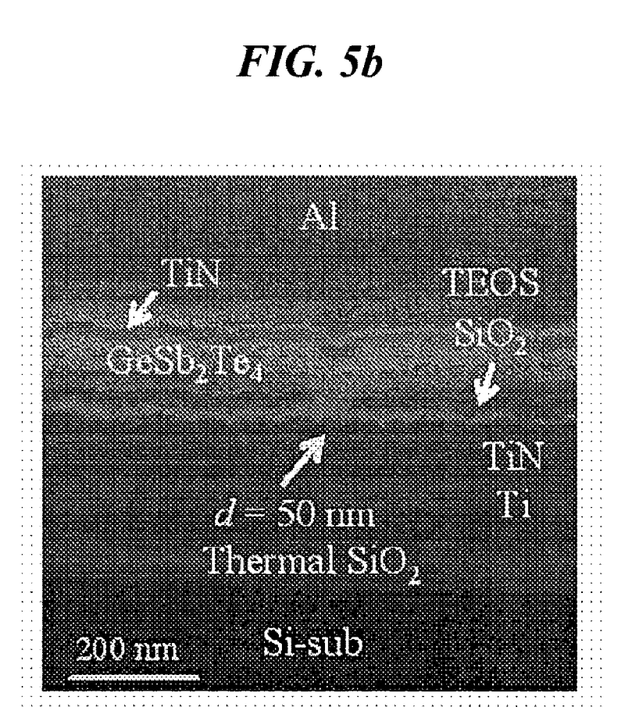

FIG. 5b shows a scanning electron microscope photograph of the non-volatile electrical phase change memory device comprising the interfacial control layer prepared above.

COMPARATIVE EXAMPLE 1

The procedure of Example 1 was repeated except that the surface of the bottom electrode exposed through the contact hole was not oxidized, to obtain a non-volatile electrical phase change memory device having no interfacial control layer.

EXPERIMENTAL EXAMPLE 4

Figure 6A:
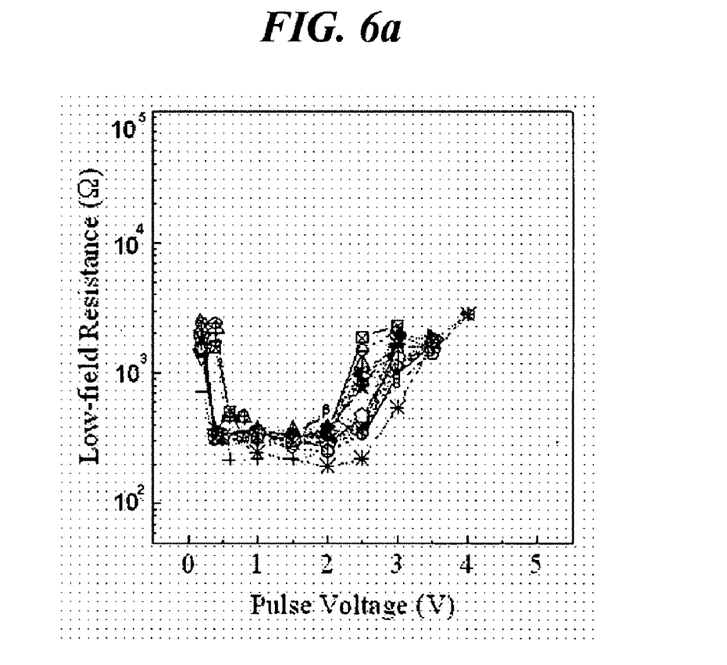
FIGS. 6a and 6b: variation in the low-field resistance as a function of the pulse voltage measured for the devices prepared in Example 1 and Comparative Example 1, respectively.
Figure 6B:
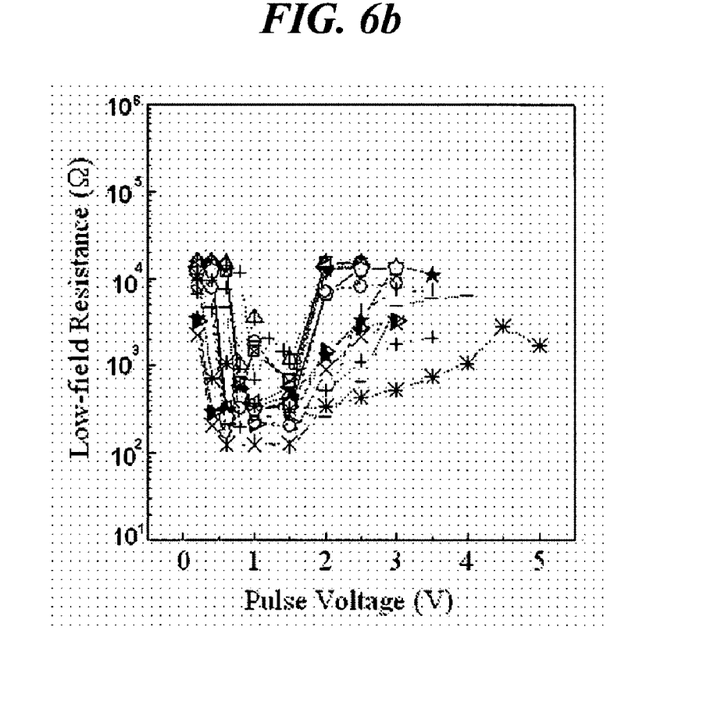

Each of the memory devices prepared in Example 1 and Comparative Example 1 was evaluated for its resistance changes by writing pulses of varying voltage supplied with a pulse generator (Agilent 81110A). Between writing operations, resistances of the devices were measured at a read voltage. The results are shown in FIGS. 6a (Ex. 1) and 6b (Com. Ex. 1).

As can be seen in FIGS. 6a and 6b, the memory device of Example 1 shows a markedly reduced resistance fluctuation as compared to the device of Comparative Example 1.

EXPERIMENTAL EXAMPLE 5

Figure 7A:
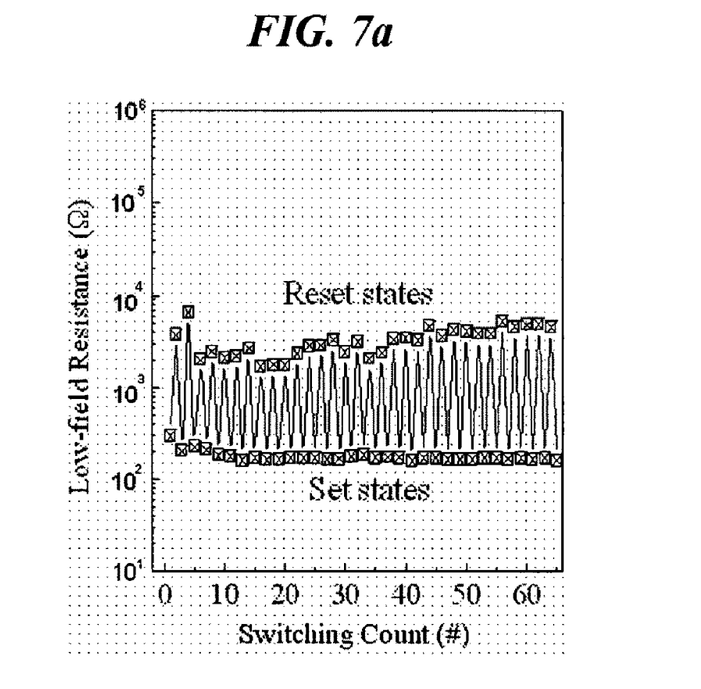
FIGS. 7a and 7b: changes in the low-field resistance during set/reset operations with the switching count, measured for the devices prepared in Example 1 and Comparative Example 1, respectively.

Each of the memory devices prepared in Example 1 and Comparative Example 1 was evaluated to examine the stability of successive switchings between the high resistance and low resistance states, by repeating application of the voltage pulse (3V, 70 ns) determined from the results of FIGS. 6a and 6b to the devices during a reset operation, followed by DC current sweeping from 0 to 5 mA for setting the device. The results are shown in FIGS. 7a (Ex. 1) and 7b (Com. Ex. 1).

Figure 7B:
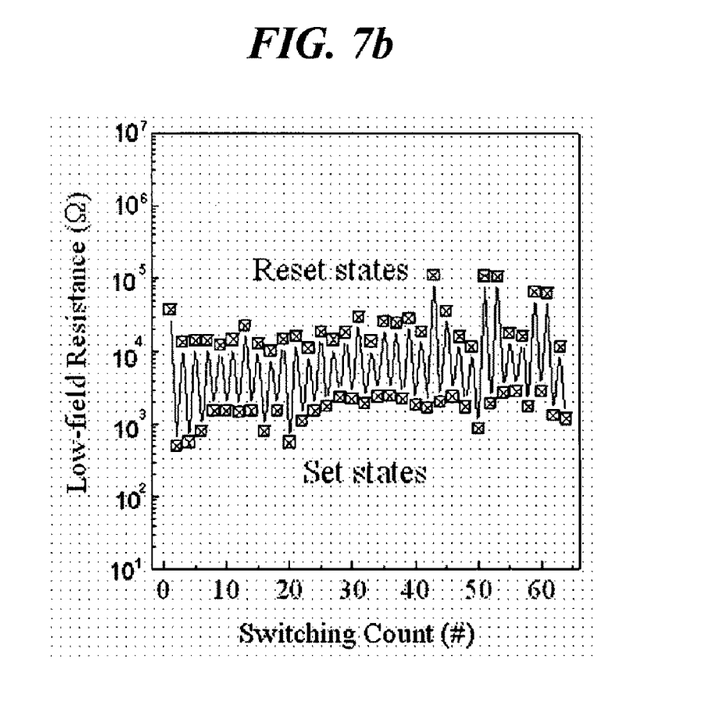

As shown in FIGS. 7a and 7b, the memory device of Example 1 has relatively uniform set/reset resistances for each switching, in contrast to the uneven pattern observed for the device of Comparative Example 1.

EXPERIMENTAL EXAMPLE 6

Figure 8A:
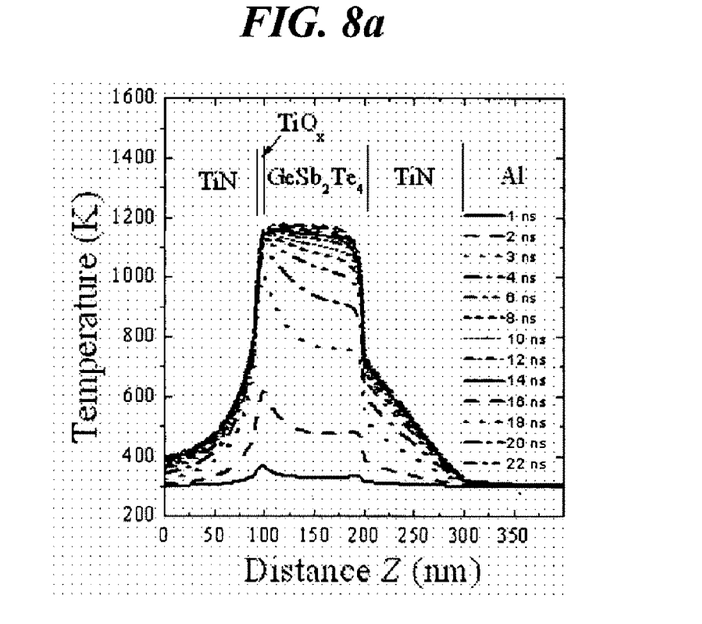
FIGS. 8a and 8b: the temperature profiles calculated during the reset operation of the devices prepared in Example 1 and Comparative Example 1, respectively.
Figure 8B:
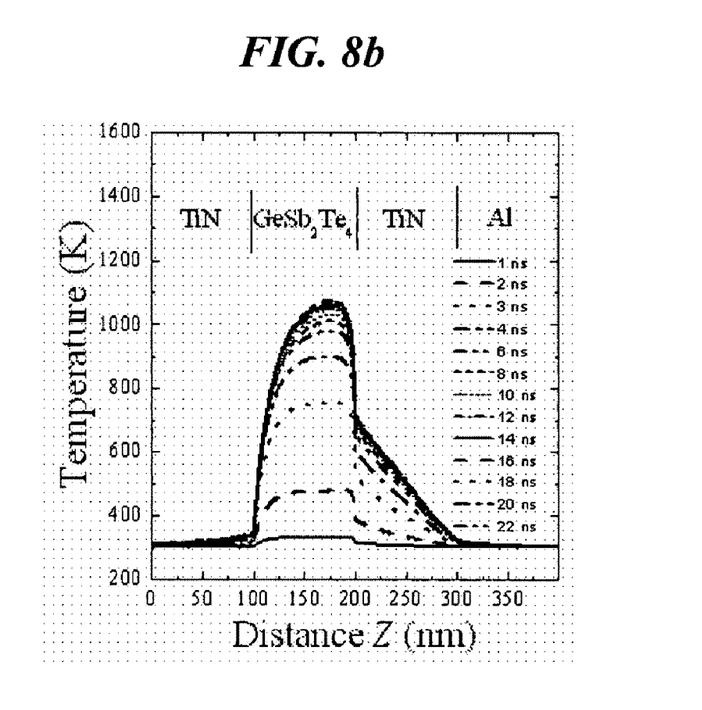

Each of the memory devices prepared in Example 1 and Comparative Example 1 was each evaluated for the temperature distribution on reset operation by use of a MATLAB™-based finite element method (FEM) toolkit. The electrical specific resistance and thermal conductivity for TiN were $25 \times 10^{-6}$ Ωcm and 19 W/mK, respectively, and those for $TiO_x$ were $3 \times 10^{-2}$ Ωcm and 5 W/mK, respectively. The results are shown in FIGS. 8a (Ex. 1) and 8b (Com. Ex. 1).

As shown in FIG. 8a, the memory device of Example 1 has a uniform temperature distribution in the phase change region adjacent to the interface due to heat-generation and heat-confinement effect from the interfacial oxidized layer, which tends to maintain a complete single phase during the set/reset operation, markedly reducing the fluctuation of the set/reset resistance and switching voltage.

In contrast, the memory devices of Comparative Example 1 undergoes heat loss at the TiN bottom electrode, leading to an unsatisfactory temperature distribution for the phase change material adjacent to the bottom electrode to reach above its melting temperature on reset operation, as shown in FIG. 8b.

EXPERIMENTAL EXAMPLE 7

Each of the memory devices prepared in Example 2 and Comparative Example 2 was evaluated for endurance against repetitive set/reset operation. Specifically, each device was subjected to alternating reset and set voltage pulses from a pulse generator (Agilent 81110A) while its resistance being measured at a low read-voltage in-between. The results are shown in FIG. 9.

Figure 9:
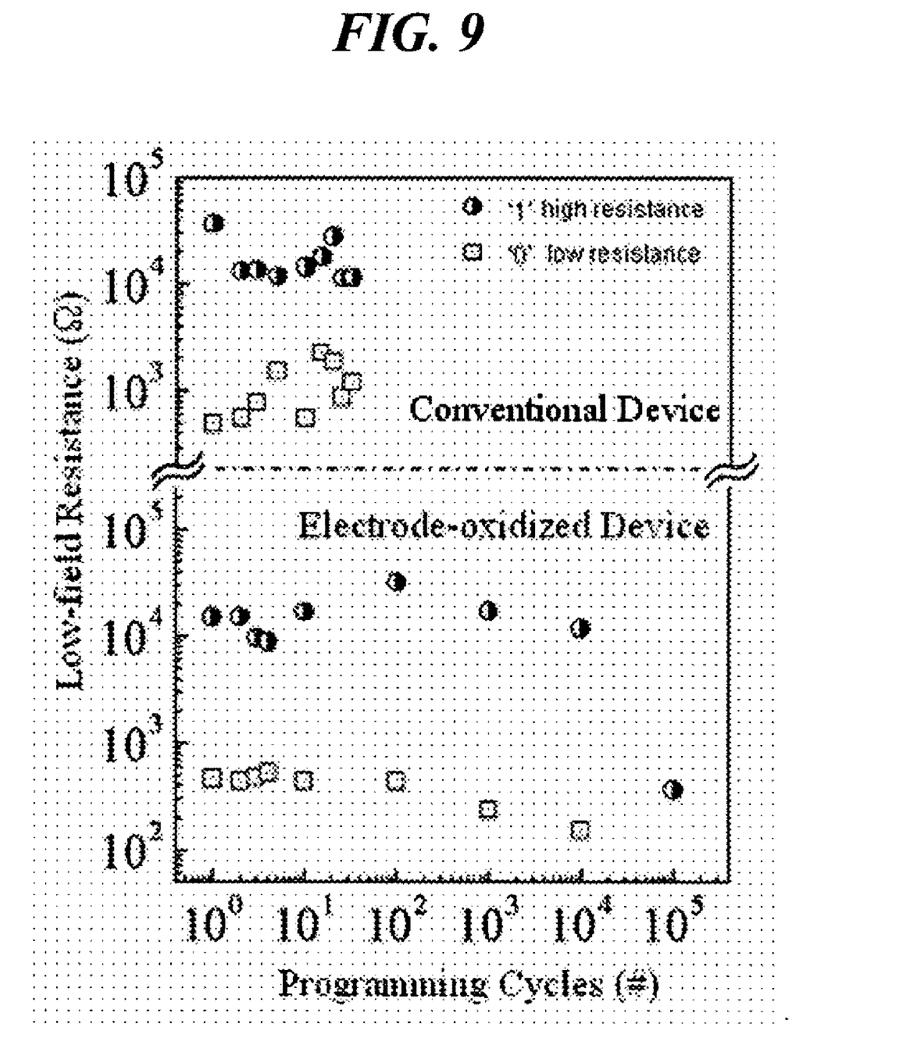
FIG. 9 variations in the low-field resistance with the programming cycle observed for the devices prepared in Example 1 and Comparative Example 1.

As shown in FIG. 9, the memory devices of Example 1 has an operational life 100 times longer than that of the device of Comparative Example 1.

While the invention has been described with respect to the specific embodiments, it should be recognized that various modifications and changes may be made by those skilled in the art to the invention which also fall within the scope of the invention as defined as the appended claims.

What is claimed is:

1. A non-volatile electrical phase change memory device comprising a substrate, a first interlayer dielectric film deposited on the substrate, a bottom electrode layer formed on the first dielectric layer, a second interlayer dielectric film formed on the bottom electrode layer, a phase change material layer deposited on the second interlayer dielectric film, and a top electrode layer formed on said phase change material layer, the bottom electrode layer being brought into contact with the phase change material layer through a contact hole which is formed in the second interlayer dielectric film and filled with the phase change material or bottom electrode material, so that the phase change layer and the bottom electrode layer come into close contact with each other, wherein an interfacial control layer is formed at the interface of the contact hole between the phase change layer and the bottom electrode layer, said interfacial control layer having strong chemical bonds with the phase change material as well as electrical resistivity and thermal conductivity values lower than those of the bottom electrode material and wherein, the interfacial control layer consists of an oxide of the bottom electrode material.

2. The phase change memory device of claim 1, wherein the oxide of the bottom electrode material is selected from the group consisting of Ti—O, Ti—N—O, Ti—Al—N—O, W—O, W—N—O, Ti—W—O and Ti—W—O—N.

3. The phase change memory device of claim 1, wherein the interfacial control layer has a thickness of 20 nm or less.

4. A method for preparing a non-volatile electrical phase change memory device of claim 1, which comprises
1) forming sequentially on the substrate the first interlayer dielectric film, the bottom electrode layer, and the second interlayer dielectric film, and then the contact hole by photolithography or electron beam lithography and subsequent etching in the second interlayer dielectric film that extends to the top surface of the bottom electrode, and optionally filling the contact hole with the bottom electrode material to bring the bottom electrode layer into contact with the phase change layer;
2) forming the interfacial control layer at the interface of the contact hole between the bottom electrode and the phase change layer; and
3) forming sequentially the phase change material layer and the top electrode layer on the second interlayer dielectric film comprising the interfacial control layer, followed by patterning using a lithography process.

5. The method of claim 4, wherein the interfacial control layer is formed by heat treatment under an oxygen atmosphere, or by oxygen plasma treatment, of the exposed surface of the bottom electrode.

6. The method of claim 4, wherein the interfacial control layer is formed by conducting an ion injection process on the exposed surface of the bottom electrode to deposit an oxide.

7. The method of claim 4, wherein the interfacial control layer is formed by depositing separately an oxide on the exposed surface of the bottom electrode.

8. The method of claim 5, wherein the oxide of the interfacial control layer is selected from the group consisting of Ti—O, Ti—N—O, Ti—Al—N—O, W—O, W—N—O, Ti—W—O and Ti—W—O—N.

9. The method of claim 6, wherein the oxide of the interfacial control layer is selected from the group consisting of Ti—O, Ti—N—O, Ti—Al—N—O, W—O, W—N—O, Ti—W—O and Ti—W—O—N.

10. The method of claim 7, wherein the oxide of the interfacial control layer is selected from the group consisting of Ti—O, Ti—N—O, Ti—Al—N—O, W—O, W—N—O, Ti—W—O and Ti—W—O—N.

* * * * *